United States Patent
Wasshuber et al.

(10) Patent No.: US 6,524,930 B1
(45) Date of Patent: Feb. 25, 2003

(54) METHOD FOR FORMING A BOTTOM CORNER ROUNDED STI

(75) Inventors: Christoph A. Wasshuber, Parker, TX (US); Zhihao Chen, Plano, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/131,958

(22) Filed: Apr. 25, 2002

(51) Int. Cl.[7] .............................................. H01L 21/76
(52) U.S. Cl. ...................................................... 438/424
(58) Field of Search ................................ 438/435, 424, 438/425, 427, 778, 762, 770, 787

(56) References Cited

U.S. PATENT DOCUMENTS

| | | |
|---|---|---|
| 5,719,085 A | 2/1998 | Moon et al. |
| 5,807,789 A | 9/1998 | Chen et al. |
| 5,863,827 A | 1/1999 | Joyner |
| 5,937,309 A | 8/1999 | Chuang |
| 5,956,598 A | 9/1999 | Huang et al. |
| 6,040,232 A | 3/2000 | Gau |
| 6,110,793 A * | 8/2000 | Lee et al. .................... 438/400 |
| 6,180,490 B1 | 1/2001 | Vassiliev et al. |
| 6,225,187 B1 | 5/2001 | Huang et al. |
| 6,348,396 B1 * | 2/2002 | Ishitsuka et al. ............ 438/424 |

OTHER PUBLICATIONS

"Roles of Sidewall Oxidation in the Devices with Shallow Trench Isolation", Pyi, S.H. et al; IEEE ELectron Device Letters, vol. 20, Issue 8, Aug. 1999, pp. 384–386.*

* cited by examiner

*Primary Examiner*—Richard Elms
*Assistant Examiner*—Beth E. Owens
(74) *Attorney, Agent, or Firm*—Yingsheng Tung; Wade James Brady, III; Frederick J. Telecky, Jr

(57) ABSTRACT

Methods are disclosed for the formation of isolation structures and trenches in semiconductor devices, in which lower corners of an isolation trench are rounded after trench formation using an oxidation process which oxidizes substrate material from the trench sidewalls and bottom faster than from the lower corners of the trench. The oxide formed during the rounding process is then removed prior to performing other etch processes, to expose substrate material having rounded lower corners. Thereafter, a liner is formed and the trench is filled with dielectric material to complete the isolation structure.

21 Claims, 8 Drawing Sheets

METHOD FOR FORMING A BOTTOM CORNER ROUNDED STI

FIELD OF INVENTION

The present invention relates generally to semiconductor devices and more particularly to methods for forming shallow trench isolation structures with rounded lower trench corners in the manufacture of semiconductor devices.

BACKGROUND OF THE INVENTION

In the fabrication of semiconductor devices, isolation structures are formed between active areas in which electrical devices such as transistors, memory cells, or the like, are to be formed. The isolation structures are typically formed during initial processing of a semiconductor substrate, prior to the formation of such electrical devices. Typical isolation techniques include local oxidation of silicon (LOCOS) and shallow trench isolation (STI) processes, by which isolation structures are formed between active regions of a semiconductor device. As semiconductor device dimensions have been reduced over the past several years, limitations on the scalability of and other problems associated with LOCOS isolation techniques, have resulted in a general trend away from LOCOS techniques and an increase in the use of STI techniques, particular in modem, high device density applications.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. A pad oxide layer and a nitride layer are typically formed over the substrate surface and patterned to expose only the isolation regions, with the prospective active device regions covered. The nitride layer operates as a hard mask during subsequent processing steps, and the pad oxide layer functions to relieve stress between the underlying silicon substrate and the nitride layer. An anisotropic (e.g., "dry") etch is then performed to form a trench through the nitride, pad oxide, and substrate. Once the trench is etched, dielectric material is deposited to fill the trench with oxide. Thereafter, the device is commonly planarized using a chemical mechanical polishing (CMP) process and the nitride protection layer is removed.

A conventional STI process is illustrated in FIGS. 1–7 to form trench isolation structures in a semiconductor device 12. In FIG. 1, a thermal oxidation process is used to grow a pad oxide layer 14 over a semiconductor substrate 16. A nitride layer 18, such as $Si_3N_4$ is then deposited in FIG. 2, such as by low pressure chemical vapor deposition (LPCVD). The nitride layer 18 is used to protect the active regions of the substrate 16 from adverse effects of the subsequent formation of isolation trenches between the active regions. The active regions of the device 12 are then masked in FIG. 3 using a patterned etch mask 20, leaving the isolation region of the nitride layer 18 exposed. A dry etch 22 is performed to form a trench 24 through the nitride layer 18, the pad oxide layer 14, and into the substrate 16. The active mask 20 is then removed in FIG. 4 and an oxide liner 26 is formed in the trench 24 to remove or repair substrate damage caused by the trench etch process 22.

Once the trench 24 and the liner 26 are formed, a dielectric material 28 is deposited in FIG. 5 via a deposition process 30 to fill the trench 24 and also to cover the nitride layer 18 in the active regions of the device 12. In FIG. 6, a chemical mechanical polishing (CMP) process 32 is used to planarize the upper surface of the device 12, which exposes the remainder of the nitride layer 18. Following planarization, the nitride layer 18 is removed via an etch process 34 in FIG. 7 to complete the isolation process. However, in conventional isolation processing, sharp corners in the isolation trench can cause various problems with the operation performance of transistors and other devices fabricated in the adjacent active regions of the device 12. In particular, the sharp lower trench corners 36 in FIG. 7 have been found to create stresses in the substrate material 16 proximate the trench 24.

Such stresses can lead to carrier mobility degradation with corresponding worsening of performance parameters (e.g., drive current capability, increased threshold voltage, etc.) in devices such as field effect transistors subsequently formed in the active regions of the device 12. In addition, the sharp corners 36 have been found to lower the threshold voltages of parasitic transistors having channels beneath the isolation structures, and hence to worsen the parasitic leakage between transistors formed on either side thereof. Thus, there remains a need for improved STI processes and techniques by which the sharpness of lower trench corners may be decreased in order to reduce or mitigate the device performance problems associated therewith.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods for forming isolation structures and STI trenches therefor in a semiconductor device, which may be carried out in a variety of semiconductor manufacturing processes. The invention involves rounding lower corners of isolation trenches prior to trench filling with dielectric materials, so as to mitigate the adverse stresses and other deleterious effects associated with the sharp corners of conventional STI methodologies on subsequently formed electrical devices. In one aspect of the invention, a trench is formed in a semiconductor substrate having sidewalls, a bottom, and lower corners between the sidewalls and the bottom. The lower comers of the trench are then rounded prior to performing further etch processes. Thereafter, an oxide liner is formed over the exposed substrate surfaces in the trench, and the trench is filled with dielectric material to form an isolation structure in the semiconductor device.

In one example, the corner rounding is accomplished through growth of a sacrificial oxide over the sidewalls and bottom of the trench immediately after forming the trench, which is removed directly thereafter via a wet etch process. The sacrificial oxide may be formed using a thermal oxidation process which oxidizes substrate material from the sidewalls and the bottom faster than from the lower corners of the trench. As a result, the lower corners of the trench are rounded off to mitigate stresses and other problems associated with sharp lower corners of prior STI trenches, such as those mentioned above. The removal of the sacrificial oxide by subsequent wet etching exposes the rounded portions of the substrate at the lower corners of the trench. Thereafter, a final oxide liner may be formed in the trench, over the sidewalls, bottom, and rounded lower corners thereof, and a trench fill deposition process is performed to fill the trench with dielectric material to form the isolation structure.

Another aspect of the invention provides for growing a second sacrificial oxide over the sidewalls and bottom of the trench after removing the first sacrificial oxide, and removing the second sacrificial oxide immediately after growing the second sacrificial oxide using a wet etch process. As with the first sacrificial oxide, the growth of the second sacrificial oxide further rounds the lower trench corners to combat the above shortcomings of prior techniques. In this regard, a thermal oxidation may also be used for the second sacrificial oxide formation, in which substrate material oxidizes from the sidewalls and the bottom faster than from the lower corners of the trench. The growth and removal of sacrificial oxides in the trench may be repeated any number of times in accordance with the invention, thus facilitating lower corner rounding to any desired degree prior to liner formation and subsequent trench filling operations.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
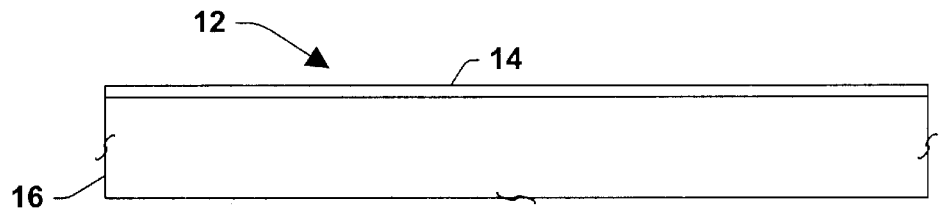
FIGS. 1–7 are partial side elevation views in section illustrating a conventional shallow trench isolation process for providing isolation between active areas in a semiconductor device.
Figure 2:
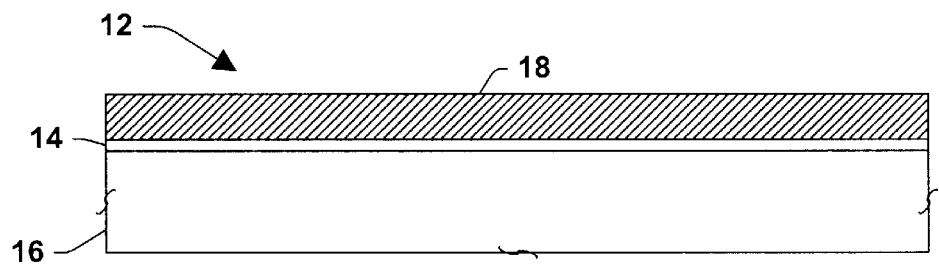
Figure 3:
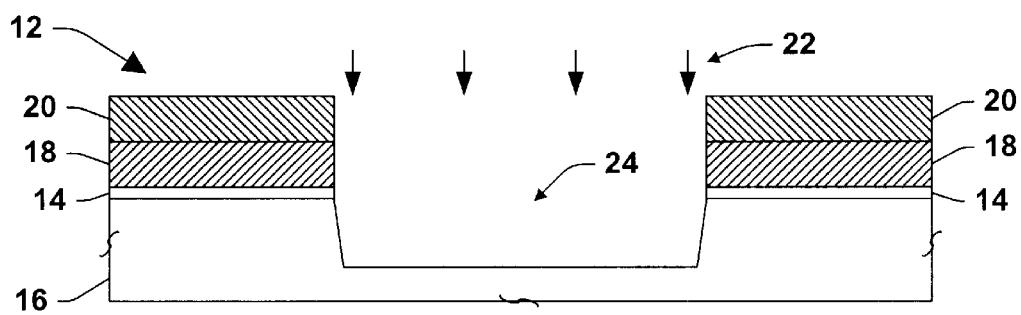
Figure 4:
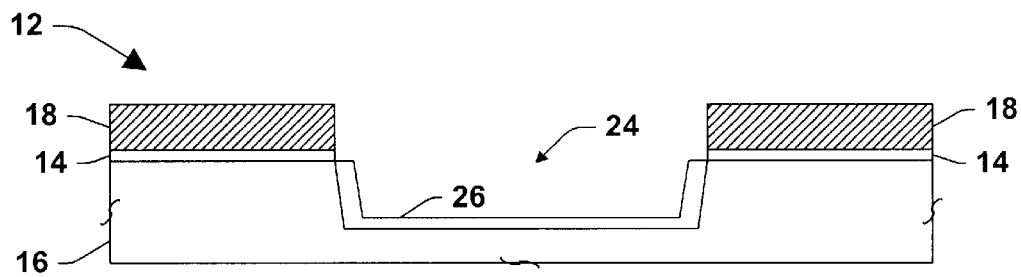
Figure 5:
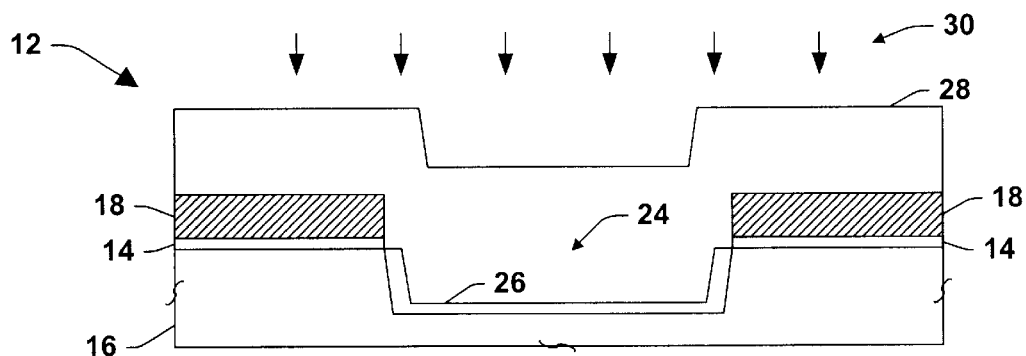
Figure 6:
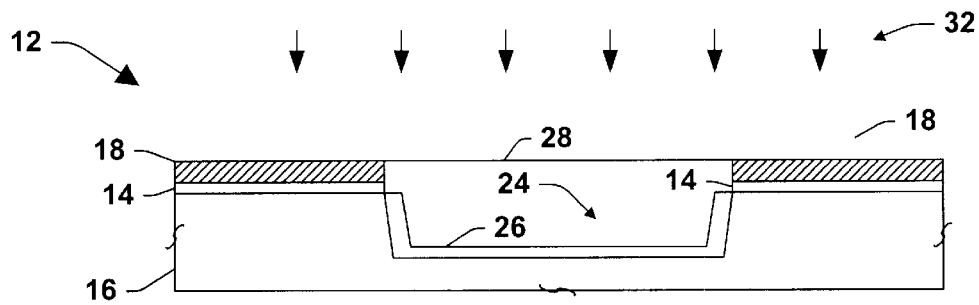
Figure 7:
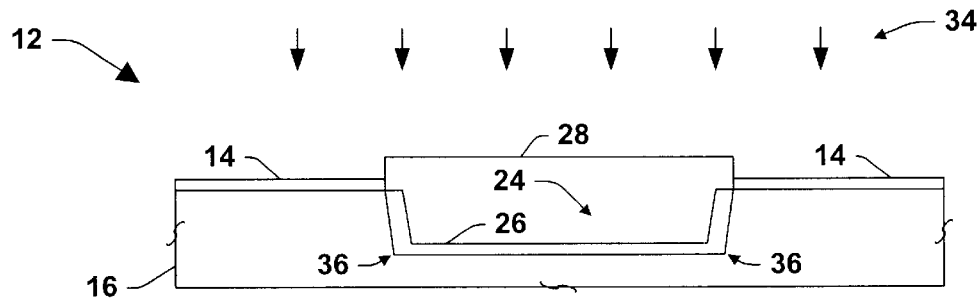

The present invention will now be described with reference to the attached drawings, wherein like reference numerals are used to refer to like elements throughout. The invention relates to methods for forming isolation structures and trenches in semiconductor devices, in which lower corners of an isolation trench are rounded after trench formation using an oxidation process which oxidizes substrate material from the trench sidewalls and bottom faster than from the lower corners of the trench. The oxide formed during the rounding process is then removed prior to performing other etch processes or trench liner formation and filling, so as to expose substrate material having rounded lower corners.

After the corner rounding, a liner is formed in the trench and the trench is filled with dielectric material to complete the isolation structure. In the following description and drawings, one or more exemplary methods are illustrated and described by which the various aspects of the invention may be implemented. However, it will be appreciated by those of ordinary skill in the art that the examples provided herein are illustrative in nature and that the present invention is not limited to the examples specifically illustrated and/or described herein.

Figure 8:
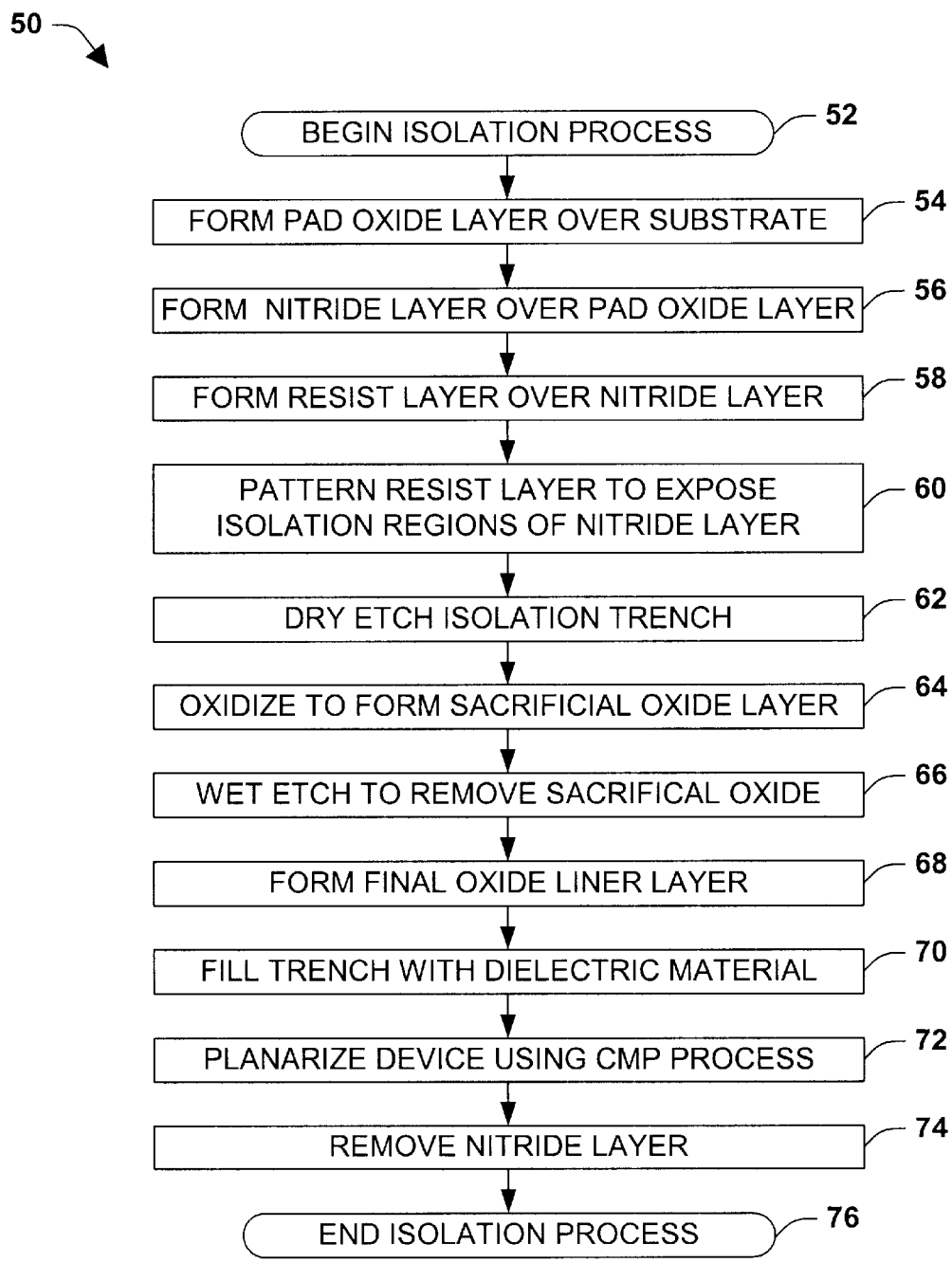
FIG. 8 is a flow diagram illustrating an exemplary method of forming an isolation trench with rounded lower corners in accordance with another aspect of the present invention.

Referring initially to FIG. 8, an exemplary method 50 is illustrated and hereinafter described for forming an isolation structure in a semiconductor device in accordance with one or more aspects of the invention. While the method 50, and other methods according to the invention, are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory devices illustrated and described herein as well as in association with other structures not illustrated or described herein.

Beginning at 52, a pad oxide layer is formed over a substrate at 54 and a nitride layer is formed over the pad oxide layer at 56. The pad oxide layer may be formed at 54 using any appropriate oxidation processes as are known, such as a thermal oxidation growth or a deposition process. The pad oxide layer may function to relieve stress between the underlying silicon substrate and the overlying nitride layer formed at 56, wherein the nitride layer operates as a hard mask in subsequent isolation processing, for example, to protect the underlying active regions of the substrate. The nitride layer may be formed at 56 using any appropriate deposition techniques and materials, such as $Si_3N_4$ deposited by low pressure chemical vapor deposition (LPCVD).

A resist layer is formed at 58 over the nitride layer, and patterned at 60 to form a patterned mask exposing isolation regions of the substrate, while covering active regions thereof. The patterning of the resist mask at 60 may be done according to known photolithography methodologies, such as by exposing select portions of the resist to a radiation source through a photomask, and removing either the exposed or the unexposed portions of the resist material so as to uncover a portion of the nitride layer in the isolation regions and to leave the active regions covered.

At 62, an isolation trench is dry etched using the patterned mask formed at 58 and 60. The trench etch at 62 may be carried out using known trench etching techniques such as reactive ion etching (RIE). For example, a multi-step RIE etch process may be performed which removes material in the exposed isolation regions so as to etch through the nitride layer, the underlying pad oxide, and into the semiconductor substrate so as to form a trench having sidewalls, a bottom, and lower corners therebetween. For instance, a first dry etch may be employed at 62 to remove the nitride and oxide material in the isolation region so as to expose the silicon wafer surface. Thereafter, a second dry etch may be performed at 62 to remove the silicon surface area through the openings in the mask to form a trench therein.

Prior to any other etch processes, a sacrificial oxide layer is formed at 64 over the substrate material of the sidewalls, bottom, and corners of the trench. The sacrificial oxide may be formed in any appropriate manner, for example by performing a thermal oxidation process to grow oxide at the exposed substrate surfaces of the bottom and sidewalls of the trench with the nitride layer preventing oxidation in the active regions while oxide is grown in the exposed trench. The inventors have appreciated that such a thermal oxidation at 64 immediately following trench formation at 62 advantageously rounds off the lower corners of the trench through oxidation of the substrate material from the sidewalls and the bottom at a higher rate than from the lower corners of the trench. After formation of the sacrificial oxide at 64, and prior to other processing, the sacrificial oxide is removed at 66 via a wet etch process, wherein the wet etch at 66 exposes rounded portions of the substrate at the lower corners of the trench prior to forming a final oxide liner layer at 68.

At 70, the trench is filled with dielectric material such as $SiO_2$ or other electrically isolating material so as to provide electrical isolation between active regions on either side of the isolation trench. The trench filling operation at 70 may comprise forming or depositing dielectric material over the device to cover the nitride layer in the active regions and to fill the trenches in the isolation regions thereof. The trench fill material may be deposited at 70 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS).

The device is then planarized at 72 to expose a portion of the nitride layer in the active regions, leaving a generally planar upper surface with portions of the nitride layer and a remaining portion of the fill material in the trench exposed. The remaining nitride material is stripped or removed at 74, for example, using a wet etch process selective so as to remove nitride material and to stop on the pad oxide layer without damaging the underlying silicon substrate material in the active regions of the device. The isolation method 50 then ends at 76. Thereafter, transistors, memory cells, and/or other electrical devices may be formed in the active regions using semiconductor processing techniques as are known.

Figure 9:
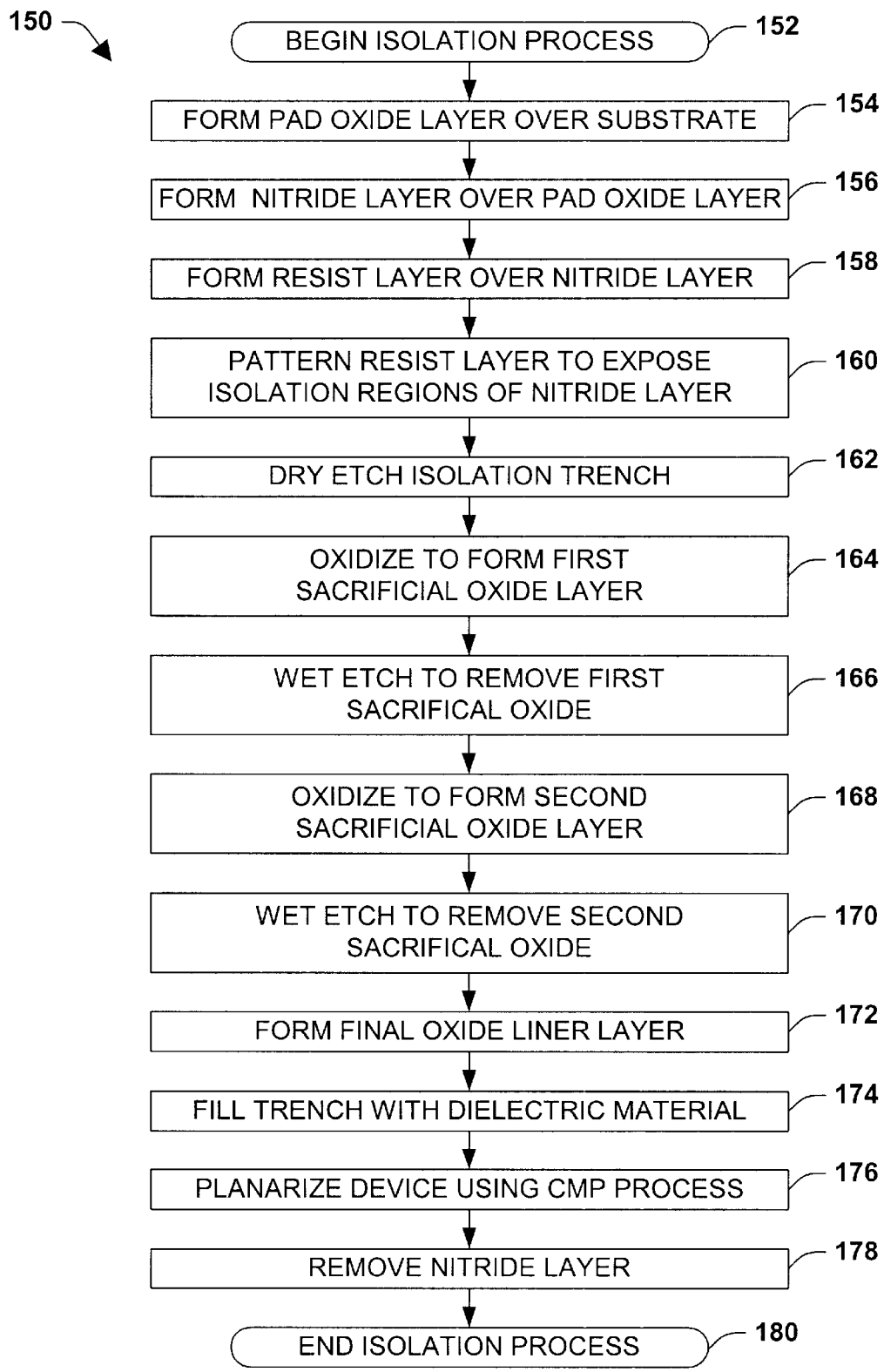
FIG. 9 is a flow diagram illustrating another exemplary method of forming an isolation trench with rounded lower corners in accordance with the invention.

Referring now to FIG. 9, another exemplary method 150 is illustrated in accordance with the invention, wherein more than one sacrificial oxide layer is used, so as to further round off the lower trench corners prior to final oxide liner formation and trench filling. Beginning at 152, a pad oxide layer is formed over a substrate at 154 and a nitride layer is formed over the pad oxide at 156. A resist layer is formed at 158 and patterned at 160 to form a patterned mask exposing isolation regions of the nitride layer. At 162, a trench is formed through dry etching using the patterned mask formed at 158 and 160. Prior to any other etch processes (e.g., immediately following the trench etch at 162), a first sacrificial oxide is formed at 164 over the substrate material of the sidewalls, bottom, and corners of the trench, such as using a thermal oxidation process which consumes silicon from the bottom and sidewalls of the trench faster than from the lower corners thereof to round off the lower trench corners. Directly following the formation of the first sacrificial oxide at 164, a wet etch process is performed at 166 to remove the first sacrificial oxide material from the trench, thereby exposing the rounded lower corners.

At 168, a second sacrificial oxide is formed in the trench, again using a thermal oxidation process similar to that used at 164 above, and thereafter another wet etch is performed at 170 to remove the second sacrificial oxide. In this manner, the lower trench corners are further rounded in accordance with the invention. The steps 168 and 170 may thereafter be repeated any number of times in order to provide a desired rounding of the lower trench corners. Once the sacrificial oxide rounding is completed, a final oxide liner is formed in the trench at 172 and the trench is filled at 174 with dielectric material such as $SiO_2$. The device is then planarized at 176 using a CMP or equivalent process, so as to expose a portion of the nitride layer in the active regions, and the remaining nitride material is stripped or removed at 178, before the method 150 then ends at 180.

Figure 10:
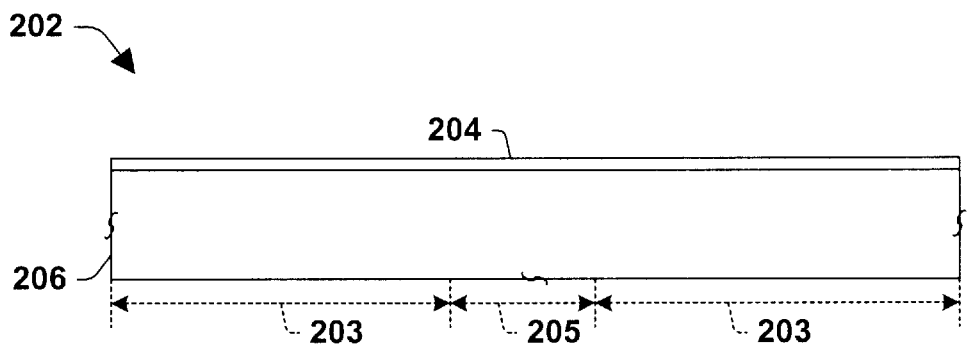
FIG. 10 is a partial side elevation view in section illustrating a pad oxide layer being formed over a semiconductor substrate in the fabrication of a trench isolation structure according to the invention.
Figure 11:
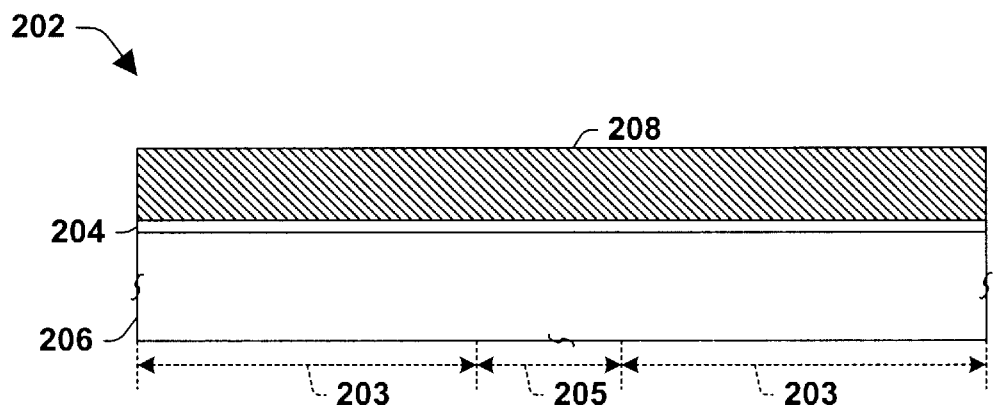
FIG. 11 is a partial side elevation view in section illustrating formation of a nitride layer over the pad oxide layer of FIG. 10.

In FIGS. 10–19, one implementation of the techniques provided by the exemplary method 50 is illustrated, wherein a semiconductor wafer or device 202 is processed to form isolation structures therein. It is noted at this point that the illustrations provided herein are not necessarily drawn to scale, and that the above methods 50 and 150 may be employed in processing structures other than those illustrated in the following figures, and further that the structures illustrated and described herein may be fabricated according to other techniques. In FIG. 10, the wafer 202 is illustrated comprising a semiconductor substrate 206, such as silicon having prospective active regions 203 in which electrical devices are to be subsequently fabricated, as well as a prospective isolation region 205 in which an isolation structure is to be formed to isolate the active regions 203 from one another. An oxidation process (not shown) is initially employed to grow a pad oxide layer 204 over the top surface of the substrate 206 as illustrated in FIG. 10. A nitride layer 208 is then is then deposited in FIG. 11, such as by low pressure chemical vapor deposition (LPCVD) of $Si_3N_4$ or equivalent nitride or equivalent material.

Figure 12:
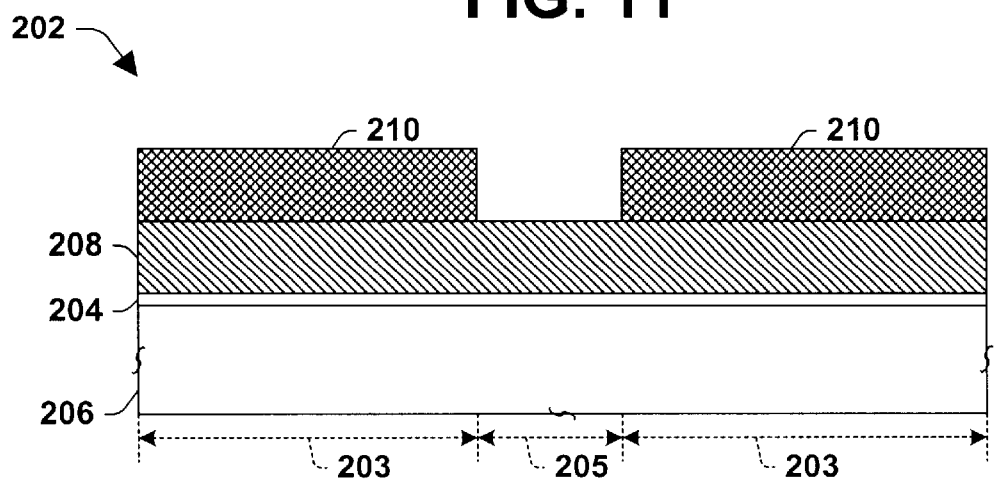
FIG. 12 is a partial side elevation view in section illustrating a patterned mask formed over the nitride layer exposing an isolation region in the device of FIGS. 10 and 11.

Thereafter in FIG. 12, a patterned mask 210 is formed to cover the active regions 203 while exposing the nitride layer 208 in the isolation region 205 for subsequent trench formation therein. A dry etch process 212 is employed in FIG. 13 to etch through the nitride layer 208, the pad oxide layer 204, and into the substrate 206 to form an isolation trench 214 to an initial depth and width in the isolation region 205, where the trench comprises sidewalls 220, a bottom 222, and lower corners 224 between the sidewalls 220 and the bottom 222. As illustrated in FIGS. 14A–14C, the resist mask 210 is then stripped or removed and a thermal oxidation process 216 is employed to form a sacrificial oxide layer 218.

The sacrificial oxide 218 may be formed using any appropriate process 216 to grow oxide at the exposed substrate surfaces of the bottom 222 and sidewalls 220 of the trench with the nitride layer 208 preventing oxidation in the active regions 203 while the oxide 218 is grown in the exposed trench 214. While not wishing to be tied to any particular theory, it is believed that because there is less oxygen available for oxidation at the lower trench corners 224, the oxidation process 216 rounds off the lower corners 224 through oxidation of the substrate material 206 from the sidewalls 220 and the trench bottom 222 at a higher rate than from the lower corners 224. Thus, the growth of the sacrificial oxide 218 consumes silicon from the substrate 206 to form oxide inner sidewalls 220' and a bottom surface 222' inwardly disposed from the silicon sidewalls 220 and bottom 220, respectively, as illustrated in FIG. 14B.

One lower corner 224 of the trench 214 is illustrated in FIG. 14C, where the oxidation process 216 has effectively moved the sidewalls 220 and bottom 222 of the silicon substrate 206 from initial positions 220" and 222", respectively. It is noted in FIG. 14C that the lower trench corner 224 following the oxidation process 216 is significantly rounder than the relatively sharp pre-oxidation corner 224". This rounding of the corners 224 may advantageously improve performance in subsequently formed electrical devices in the active regions 203 of the device 202 by reducing or mitigating post trench-fill stresses caused by sharp corners in conventional STI structures.

Figure 13:
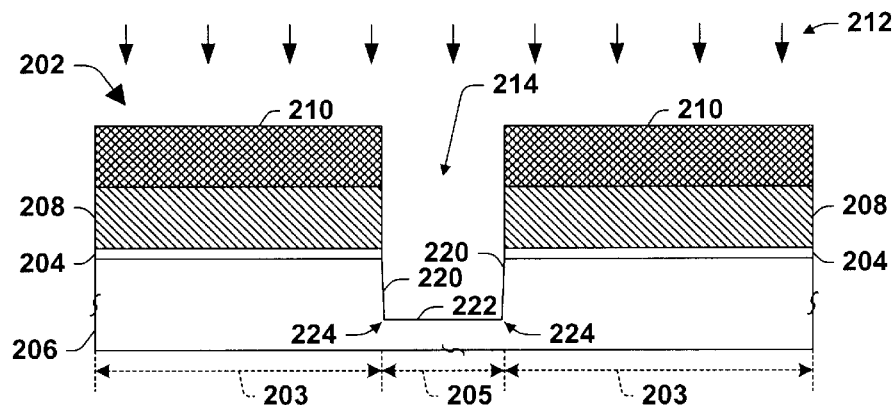
FIG. 13 is a partial side elevation view in section illustrating a dry etch process for initially forming a trench in the device of FIGS. 10–12.
Figure 14A:
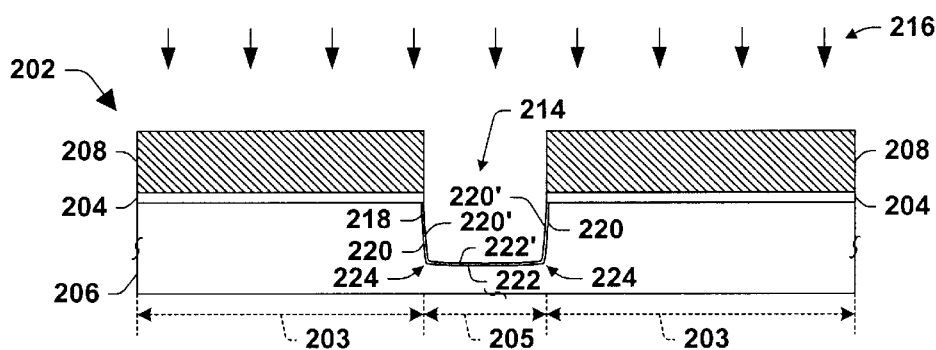
FIG. 14A is a partial side elevation view in section illustrating formation of a sacrificial oxide layer after formation of the trench of FIG. 12 according to an aspect of the invention.
Figure 14B:
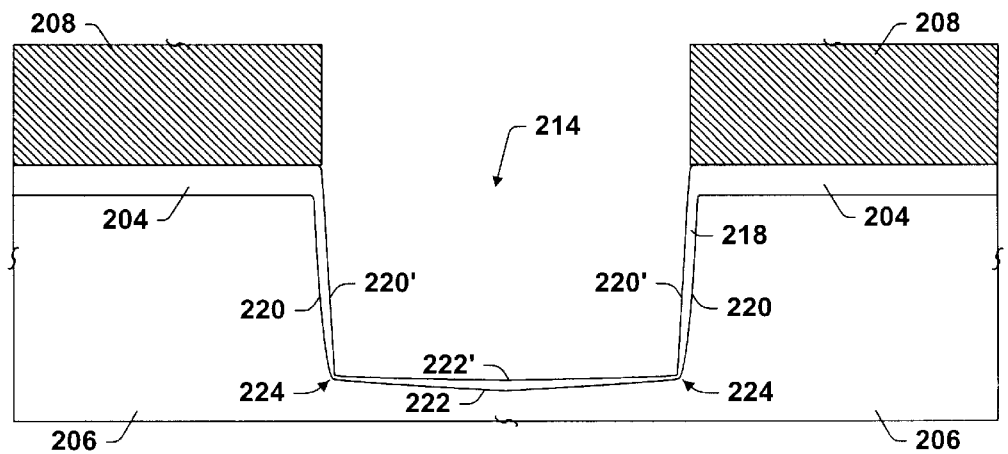
FIG. 14B is a partial side elevation view in section illustrating the effects of different oxidation rates for substrate material at the trench sidewalls and bottom, and at the lower trench corners following formation of the sacrificial oxide layer of FIG. 14A.
Figure 14C:
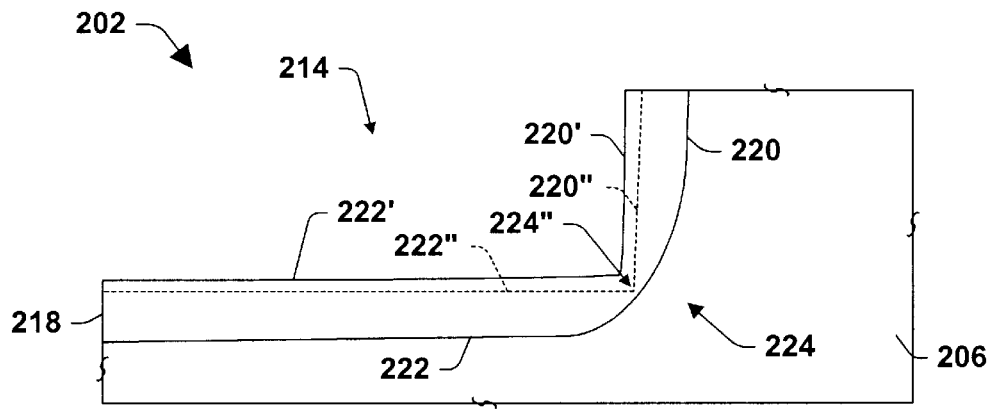
FIG. 14C is a partial side elevation view in section illustrating the corner rounding effect of the sacrificial oxide formation of FIGS. 14A and 14B.

It is further noted that the sidewalls 220 following oxidation 216 are outwardly disposed from their pre-oxidation locations 220", and the post-oxidation bottom 222 is beneath the pre-oxidation bottom 222", whereby the oxidation 216 results in wider and deeper trench dimensions than were originally etched in FIG. 13. Accordingly, another aspect of the invention provides for formation of the trench to narrower and/or shallower dimensions than those desired via control of the width dimensions of the mask 210 (e.g., FIGS. 12 and 13) as well as control of the dry trench etch process 212, so as to provide for final (e.g., post oxidation rounding) trench dimensions (e.g.., width and depth) according to a particular device design.

In this regard, it is noted that the oxidation process 216 may provide a sacrificial oxide thickness at the widest point along the sidewalls 220 (e.g., and near the center of the trench bottom 222) of about 10 to 150 Å or more, which consumes silicon from the substrate 206 at a higher rate near the mid sections of the bottom 222 and the sidewalls 220 than at the lower corners 224. The invention thus provides compensation for the expansion of the trench dimensions due to the growth and subsequent removal of the sacrificial oxide 218, so as to provide a desired degree of lower trench corner rounding while achieving desired final trench dimensions in the device 202.

Figure 15A:
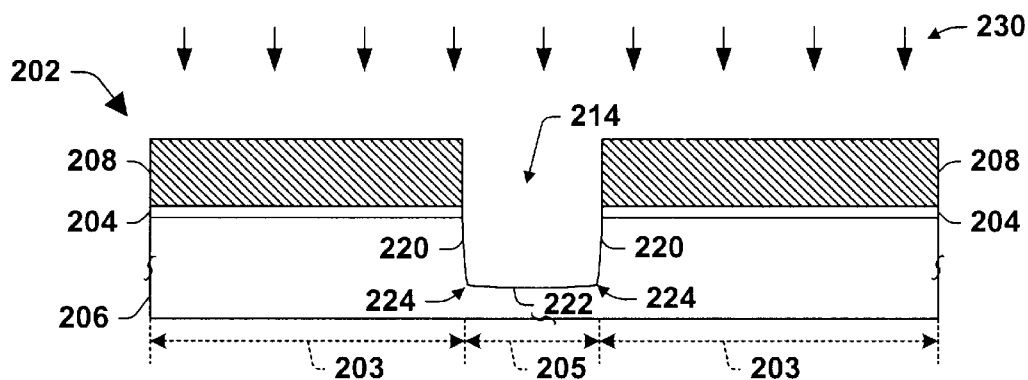
FIG. 15A is a partial side elevation view in section illustrating removal of the sacrificial oxide layer of FIGS. 14A–14C using a wet etch process after formation thereof in accordance with the invention.
Figure 15B:
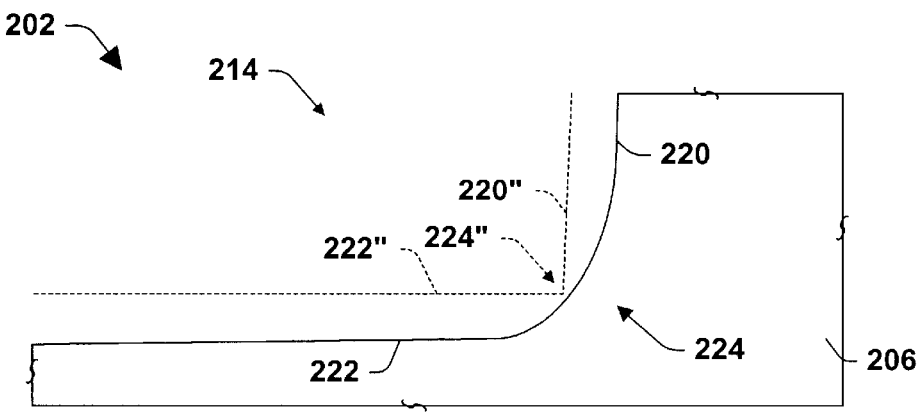
FIG. 15B is a partial side elevation view in section illustrating the rounded lower trench corner exposed by the removal of the sacrificial oxide layer of FIGS. 14A–14C.

Referring now to FIGS. 15A and 15B, following formation of the sacrificial oxide 218 and prior to other processing, the sacrificial oxide 218 is removed using a wet etch process 230, thereby exposing the rounded portions of the substrate 206 at the lower corners 224 of the trench 214 (e.g., as well as exposing the silicon trench sidewalls 220 and trench bottom 222) prior to forming a final oxide liner. As illustrated in FIG. 15B, the resulting trench sidewalls 220 are outwardly disposed from the initial sidewall positions 220" and the trench bottom 222 is deeper than the initial bottom 222". Moreover, the corner 224 exposed following the oxidation 216 and the wet etch 230 is significantly more rounded than the original corner 224" (e.g., illustrated in phantom in FIG. 15B). The inventors have appreciated that the rounding by the oxidation process 216 and the resulting rounded lower trench corners 224 may reduce or mitigate the stress related problems experienced with sharp trench corners in the past, such as structural cracking, carrier mobility reduction, reduced drive current capabilities, and the like.

Figure 16:
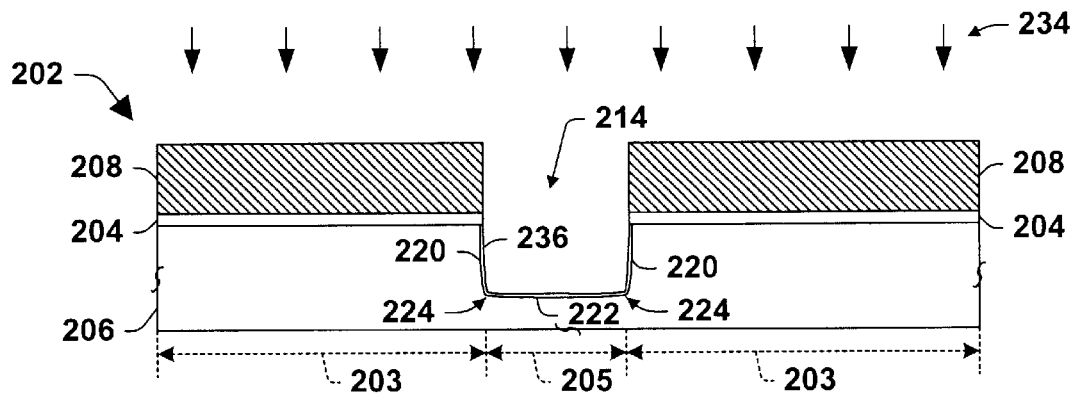
FIG. 16 is a partial side elevation view in section illustrating formation of a final oxide liner in the trench of FIGS. 15A and 15B.
Figure 17:
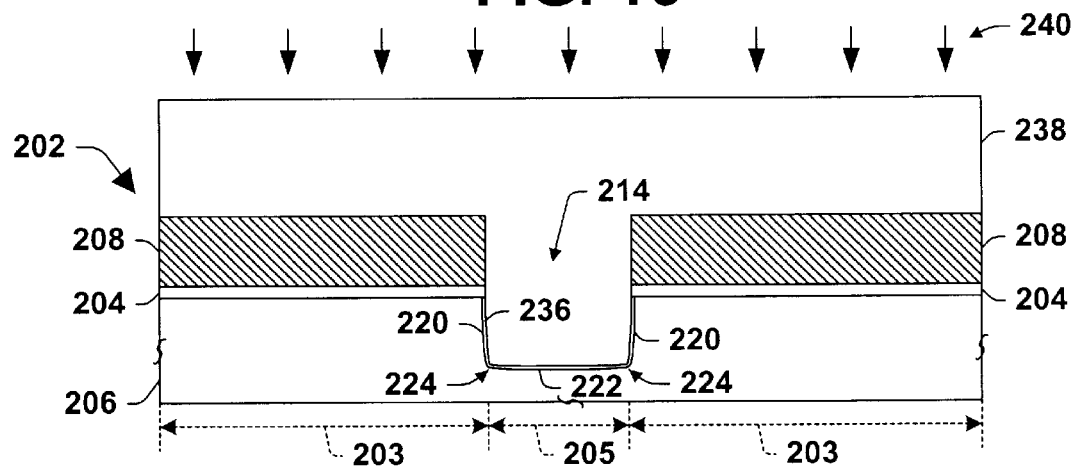
FIG. 17 is a partial side elevation view in section illustrating deposition of dielectric trench fill material into the trench and over the upper portions of the device of FIG. 16.

In accordance with another aspect of the invention (e.g., as illustrated and described above with respect to method 150 of FIG. 9), the sacrificial oxide formation and removal of FIGS. 14A–15B may be repeated any number of times, by which further rounding of the lower trench corners 224 may be facilitated. Referring now to FIG. 16, once the desired rounding is achieved through one or more iterations of sacrificial oxide formation and wet etch removal thereof, a liner 236 is formed in the trench 214, such as through oxidation of the exposed portions of the trench 214 using a process 234. The trenches 214 are then filled in FIG. 17 with electrically isolating material 238 such as via a deposition process 240. The process 240 may involve any appropriate deposition methodologies as are known, such as depositing $SiO_2$ or other isolating material 238 using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials 238 and deposition processes 240 are contemplated as falling within the scope of the appended claims.

Figure 18:
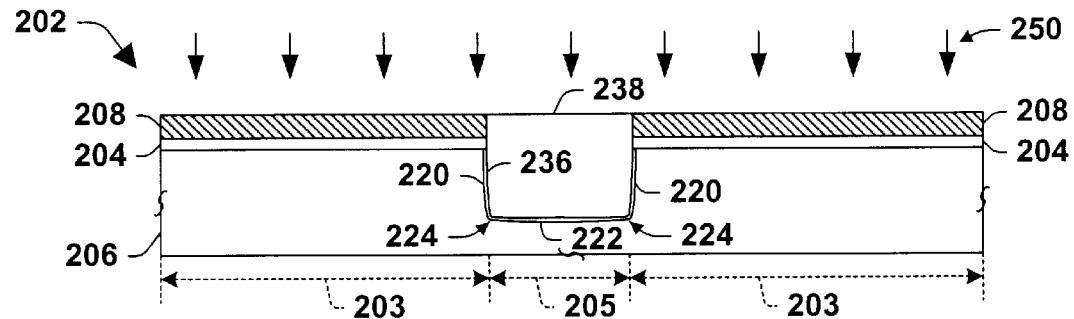
FIG. 18 is a partial side elevation view in section illustrating planarization of the device of FIG. 17 using a CMP process.
Figure 19:
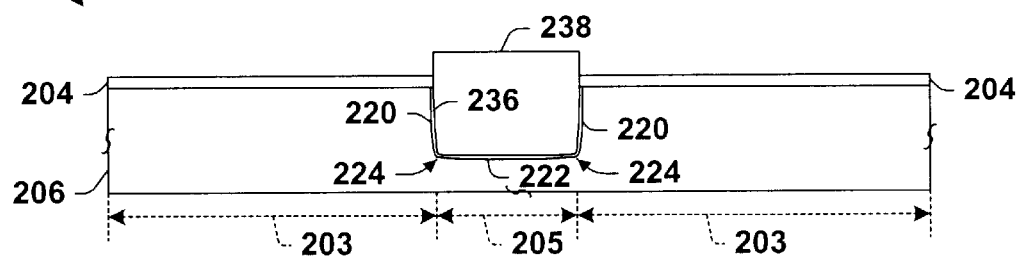
FIG. 19 is a partial side elevation view in section illustrating removal of the nitride layer from the device of FIG. 18.

Thereafter in FIG. 18, a planarization process 250 is performed to remove the upper portions of the fill material 238 as well as upper portions of the nitride layer 208. The process 250 preferably comprises a chemical-mechanical polishing (CMP) process wherein a generally planar upper surface is provided in the device 202. Subsequently in FIG. 19, the remainder of the nitride layer material 208 is stripped or otherwise removed, leaving a finished STI isolation structure comprising the trench 214 filled with dielectric material 238. Thereafter, transistors, memory cells, and/or other electrical devices (not shown) may be formed in the active regions using semiconductor processing techniques as are known.

In the device of FIGS. 10–19, a single sacrificial oxide 218 is formed and removed prior to the formation of the final liner layer 236 and trench filling operations, in accordance with the exemplary method 50 of FIG. 8. However, in accordance with another aspect of the invention, two or more such sacrificial oxidations may be performed, wherein each such sacrificial oxide formed thereby in the trench 214 is immediately removed following formation. It will be appreciated that each such oxidation/removal may advantageously result in increased roundness of the lower trench corners 224, and that the oxidation process parameters and the number of such iterations may be adjusted according to the desired corner roundness so as to mitigate the above mentioned stress related difficulties associated with sharp lower trench corners. In addition, it will be appreciated that the initial sizing (e.g., width) of the opening in the patterned mask 210 (FIG. 12) can be reduced so as to achieve a desired final trench width following all such iterations of sacrificial oxide formation/removal. Furthermore, the initial depth of the trench resulting from the dry etch process 212 (FIG. 13) may be adjusted so as to achieve a desired final trench depth following such iterations, in accordance with another aspect of the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming an isolation structure in a semiconductor device, comprising:
    forming a trench having sidewalls and a bottom in an isolation region of a semiconductor substrate using a dry etch process;
    forming a first oxide layer over the sidewalls and bottom of the trench immediately after forming the trench;
    removing the first oxide layer immediately after forming the first oxide layer using a wet etch process;
    forming a second oxide layer over the sidewalls and bottom of the trench; and
    filling the trench with dielectric material to form an isolation structure.

2. The method of claim 1, further comprising removing the second oxide layer using a second wet etch process, and forming a third oxide layer over the sidewalls and bottom of the trench prior to filling the trench with dielectric material.

3. The method of claim 1, further comprising planarizing the device following filling the trench with dielectric material.

4. The method of claim 1, wherein forming the trench comprises etching through a pad oxide layer overlying the substrate and a nitride layer overlying the pad oxide layer in the isolation region, and etching through a portion of the substrate in the isolation region to form the trench using a dry etch process.

5. The method of claim 1, wherein forming the first oxide layer comprises growing an oxide layer over the sidewalls and bottom of the trench immediately after forming the trench using a thermal oxidation process.

6. The method of claim 5, wherein growing the oxide layer over the sidewalls and bottom of the trench comprises rounding unoxidized portions of the substrate in lower corners of the trench.

7. The method of claim 6, wherein removing the first oxide layer comprises exposing rounded unoxidized portions of the substrate in lower corners of the trench.

8. The method of claim 1, wherein forming the first oxide layer comprises rounding portions of the substrate in lower corners of the trench.

9. The method of claim 8, wherein removing the first oxide layer comprises exposing rounded portions of the substrate in lower corners of the trench.

10. The method of claim 1, wherein forming the second oxide layer comprises growing a final oxide liner over the sidewalls and bottom of the trench using a thermal oxidation process.

11. A method of forming an isolation trench in a semiconductor device, comprising:
    forming a pad oxide layer over a semiconductor substrate;
    forming a nitride layer over the pad oxide layer;
    patterning the nitride layer and the pad oxide layer to expose portions of the substrate in an isolation region;
    dry etching the exposed portions of the substrate to form a trench having sidewalls, a bottom, and lower corners between the sidewalls and the bottom in the isolation region;
    growing a first sacrificial oxide liner over the sidewalls and bottom of the trench immediately after forming the trench;
    removing the first sacrificial oxide liner immediately after growing the first sacrificial oxide liner using a wet etch process; and
    growing a second oxide liner over the sidewalls and bottom of the trench.

12. The method of claim 11, further comprising filling the trench with dielectric material and planarizing the device to form an isolation structure.

13. The method of claim 11, further comprising:
    growing a second sacrificial oxide over the sidewalls and bottom of the trench after removing the first sacrificial oxide liner; and
    removing the second sacrificial oxide liner immediately after growing the second sacrificial oxide liner using a wet etch process prior to growing the second oxide liner.

14. The method of claim 11, wherein growing the first sacrificial oxide liner comprises rounding off portions of the substrate in lower corners of the trench using a thermal oxidation process which oxidizes substrate material from the sidewalls and the bottom faster than from the lower corners.

15. The method of claim 14, wherein removing the first sacrificial oxide liner comprises exposing rounded portions of the substrate at the lower corners of the trench using the wet etch process.

16. A method of forming an isolation structure in a semiconductor device, comprising:
    etching portions of a substrate to form a trench therein having sidewalls, a bottom, and lower corners between the sidewalls and the bottom using a dry etch process;
    rounding lower corners of the trench prior to performing any other etch processes;
    forming an oxide liner over exposed substrate surfaces in the trench; and
    filling the trench with dielectric material to form an isolation structure in the semiconductor device.

17. The method of claim 16, wherein rounding the lower corners of the trench comprises:
    growing a first sacrificial oxide over the sidewalls and bottom of the trench immediately after forming the trench; and
    removing the first sacrificial oxide immediately after growing the sacrificial oxide using a wet etch process.

18. The method of claim 17, wherein rounding the lower corners comprises:
    growing a second sacrificial oxide over the sidewalls and bottom of the trench after removing the first sacrificial oxide; and
    removing the second sacrificial oxide immediately after growing the second sacrificial oxide using a wet etch process.

19. The method of claim 17, wherein growing the first sacrificial oxide comprises performing a thermal oxidation process which oxidizes substrate material from the sidewalls and the bottom faster than from the lower corners of the trench.

20. The method of claim 19, wherein removing the first sacrificial oxide comprises exposing rounded portions of the substrate at the lower corners of the trench prior to forming the oxide liner.

21. The method of claim 17, wherein etching portions of a substrate to form the trench comprises forming the trench having an initial width narrower than a final desired trench width and an initial depth shallower than a final desired trench depth to compensate for growing the first sacrificial oxide over the sidewalls and bottom of the trench.

* * * * *